United States Patent
Jacobs et al.

(10) Patent No.: US 7,135,410 B2
(45) Date of Patent: Nov. 14, 2006

(54) ETCH WITH RAMPING

(75) Inventors: Keren Jacobs, Saratoga, CA (US);
Aaron Eppler, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 49 days.

(21) Appl. No.: 10/672,151

(22) Filed: Sep. 26, 2003

(65) Prior Publication Data
US 2005/0070117 A1    Mar. 31, 2005

(51) Int. Cl.
*H01L 21/302* (2006.01)

(52) U.S. Cl. .................. 438/712; 438/723; 438/724; 156/345.33

(58) Field of Classification Search ........... 438/710, 438/712, 714, 723, 724; 156/345.33
See application file for complete search history.

(56) References Cited

U.S. PATENT DOCUMENTS

| | | | |
|---|---|---|---|
| 4,729,815 A | 3/1988 | Leung | 156/643 |
| 5,807,789 A | 9/1998 | Chen et al. | 438/714 |
| 5,843,226 A | 12/1998 | Zhao et al. | 117/97 |
| 6,040,619 A * | 3/2000 | Wang et al. | 257/649 |
| 6,051,503 A * | 4/2000 | Bhardwaj et al. | 438/705 |
| 6,449,038 B1 * | 9/2002 | Stolze | 356/316 |
| 6,599,839 B1 * | 7/2003 | Gabriel et al. | 438/705 |
| 6,828,251 B1 * | 12/2004 | Su et al. | 438/724 |
| 6,949,203 B1 * | 9/2005 | Hsieh et al. | 216/67 |
| 2003/0153193 A1 * | 8/2003 | Fuse et al. | 438/710 |

FOREIGN PATENT DOCUMENTS

JP    S63-13334    1/1988

OTHER PUBLICATIONS

International Search Report, mailed on Dec. 15, 2004.

* cited by examiner

*Primary Examiner*—Nadine Norton
*Assistant Examiner*—Binh X. Tran
(74) *Attorney, Agent, or Firm*—Beyer Weaver & Thomas, LLP

(57) ABSTRACT

A method for etching a feature in an etch layer through a mask over a substrate. The substrate is placed in a process chamber. An etch plasma is provided to the process chamber, where the etch plasma begins to etch. A feature is etched in the etch layer with the etch plasma. At least one etch plasma parameter is ramped during the etching of the feature to optimize plasma parameters with the changing etch depth and the feature is etched with the ramped plasma until the feature is etched to a feature depth.

17 Claims, 8 Drawing Sheets

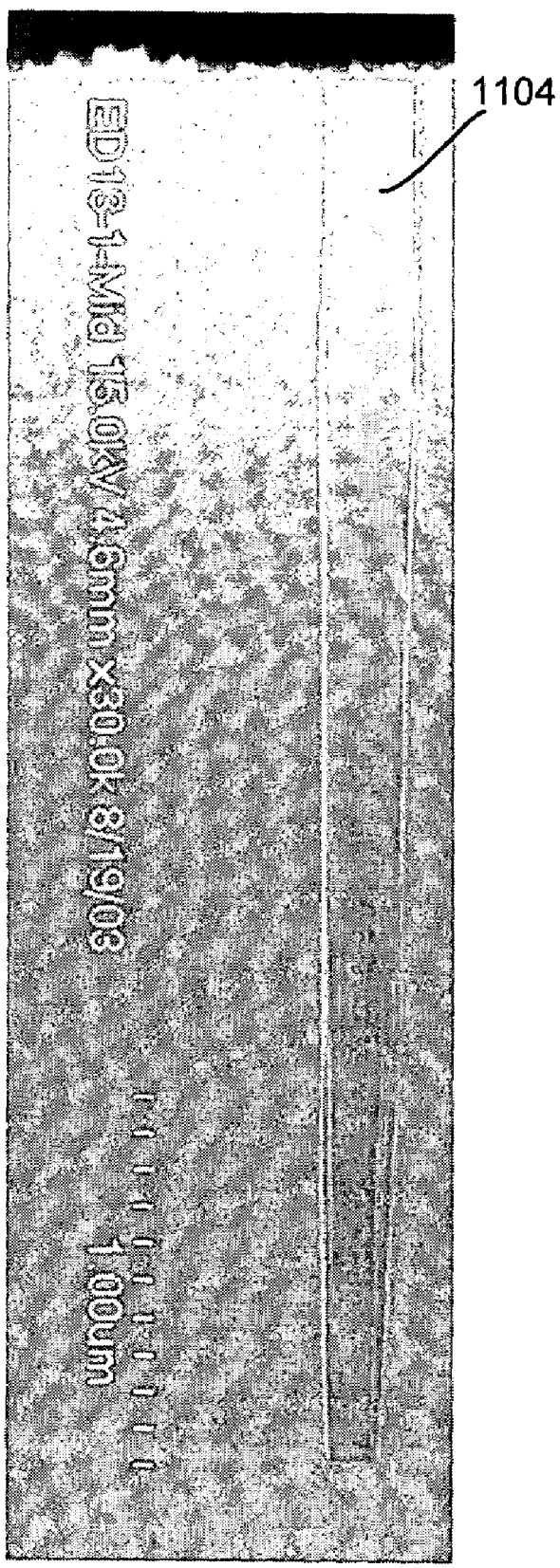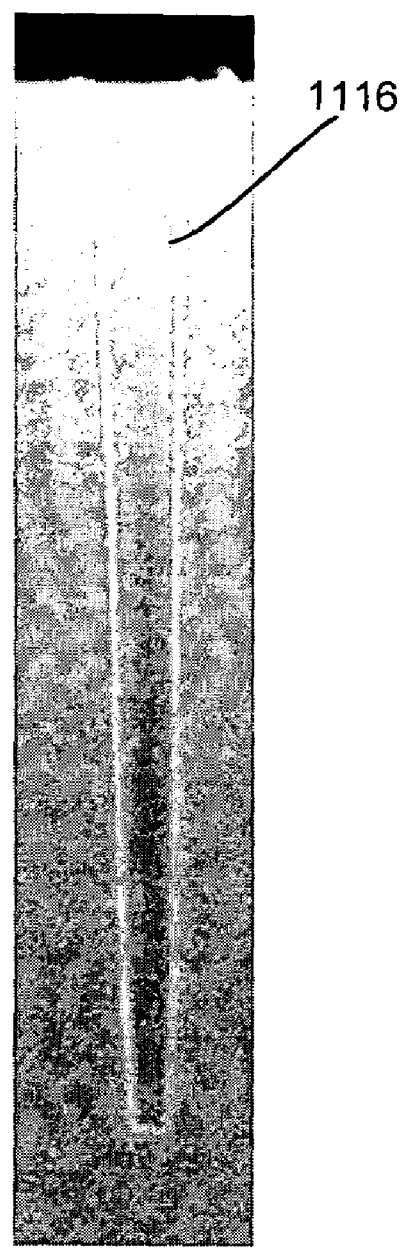
FIG. 11A
FIG. 11B

ETCH WITH RAMPING

BACKGROUND OF THE INVENTION

The present invention relates to plasma etching. More particularly, the present invention relates to plasma etching to form deep openings with high aspect ratios such as, but not limited to, high-aspect ratio contacts (HARC).

During semiconductor wafer processing, features of the semiconductor device are defined in the wafer using well-known patterning and etching processes. In these processes, a photoresist (PR) material may be deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

In general, the coupling capacitance in an integrated circuit is directly proportional to the dielectric constant, k, of the material used to form the dielectric layers. The dielectric layers in conventional integrated circuits have traditionally been formed of $SiO_2$, which has a dielectric constant of about 4.0. As a consequence of the increasing line densities and operating frequencies in semiconductor devices, dielectric layers formed of $SiO_2$ may not effectively insulate the conductive lines to the extent required to avoid increased coupling capacitance levels.

In an effort to reduce the coupling capacitance levels in integrated circuits, the semiconductor industry has engaged in research to develop materials having a dielectric constant lower than that of $SiO_2$, which are suitable for use in forming the dielectric layers in integrated circuits. A number of promising materials, which are sometimes referred to as "low-k materials", have been developed. In the specification and claims, low-k materials are defined as materials with a dielectric constant k that is less than 4. Fluorosilicate glass is one example of a low-k dielectric, which has a dielectric constant of about 3.7. This composes an about 7–9% fluorine doped into $SiO_2$.

Another interesting class of low-k materials is compounds including organosilicate glass, or OSG. By way of example, but not limitation, such organosilicate dielectrics include CORAL™ from Novellus of San Jose, Calif.; Black Diamond™ from Applied Materials of Santa Clara, Calif.; Aurora™ available from ASM International N.V., The Netherlands; Sumika Film® available from Sumitomo Chemical America, Inc., Santa Clara, Calif., and HOSP™ from Allied Signal of Morristown, N.J. Organosilicate glass materials have carbon and hydrogen atoms incorporated into the silicon dioxide lattice which lowers the density, and hence the dielectric constant of the material. A dielectric constant for such films is typically <3.0.

High-aspect ratio openings have a high opening depth to opening diameter ratio. A mask, such as a photoresist mask or a hard mask, is used to provide an opening pattern. If a thick mask is required to allow the etching of a high-aspect ratio opening, the critical dimension of the opening may be limited by the thickness of the mask.

Various generations of photoresist are being developed. New photoresists may be less resistant to etching. Etches using such photoresists may have low selectivities.

SUMMARY OF THE INVENTION

To achieve the foregoing and in accordance with the purpose of the present invention a method for etching a feature in an etch layer through a mask over a substrate. The substrate is placed in a process chamber. An etch plasma is provided to the process chamber, where the etch plasma begins to etch. A feature is etched in the etch layer with the etch plasma. At least one etch plasma parameter is ramped during the etching of the feature to optimize plasma parameters to the changing etch depth and the feature is etched with the ramped plasma until the feature is etched to a feature depth.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 11A is a photomicrograph of a cross section of a feature etched using the second ramp test main etch, after the photoresist has been stripped.

FIG. 11B is a photomicrograph of the cross section of the feature etched using the baseline etch after the photoresist has been stripped.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
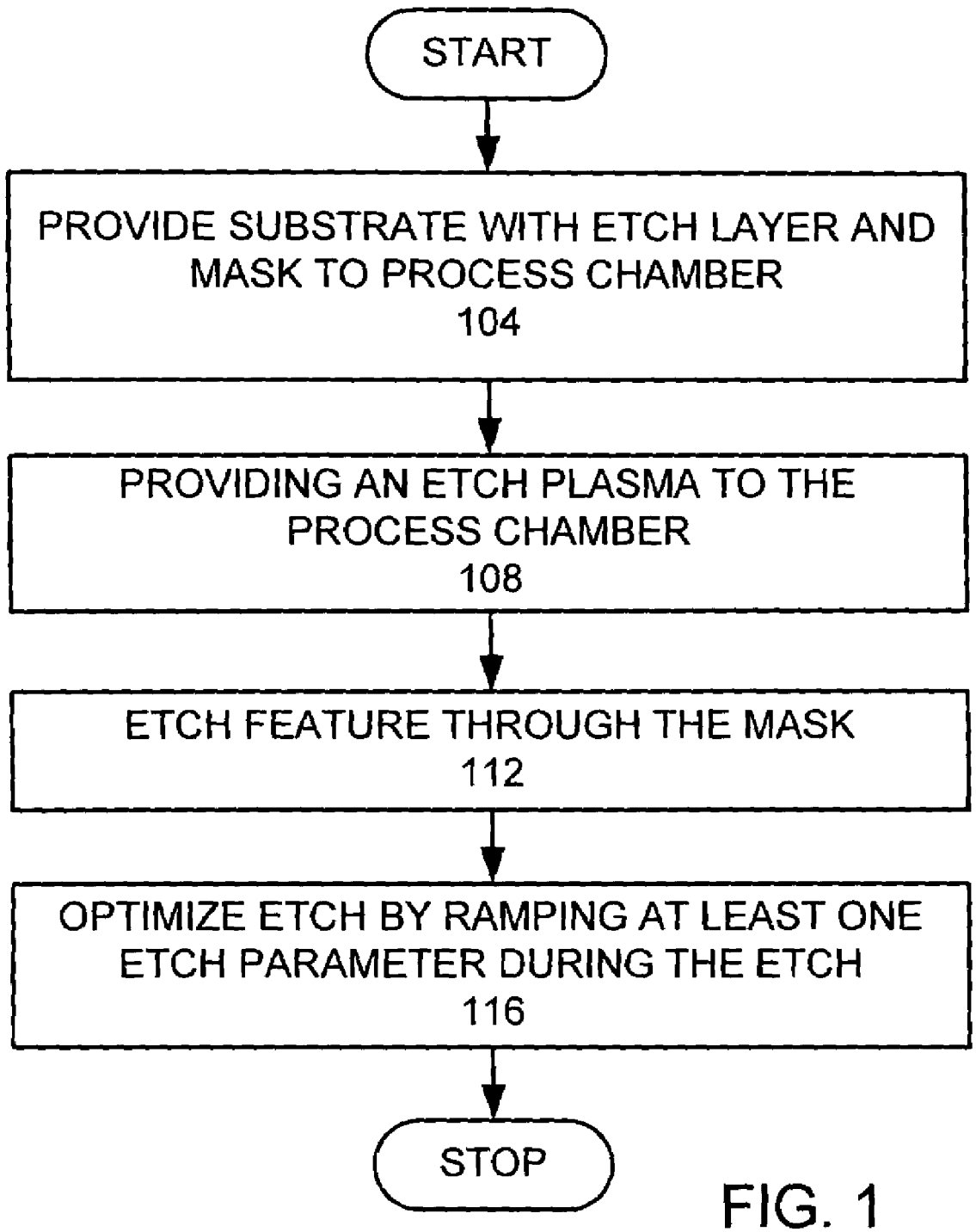
FIG. 1 is a high level flow chart of an embodiment of the invention.
Figure 2A:
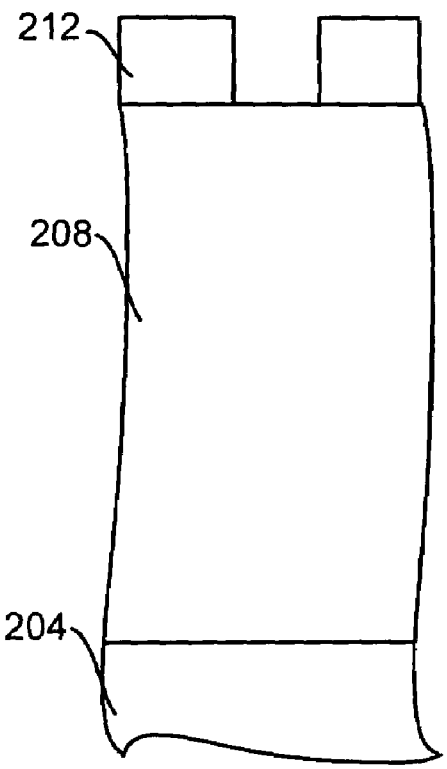
FIGS. 2A and 2B are cross-sectional schematic view of a substrate, which is processed according to the invention.

FIG. 1 is a high level flow chart of an embodiment of the invention. A substrate with an etch layer and a mask is provided to a process chamber (step 104). FIG. 2A is a cross-sectional schematic view of a substrate 204, which may be part of a wafer or a layer over a wafer. An etch layer 208 is formed over the substrate 204. Although the etch layer 208 is shown to be on the substrate 204, in other embodiments one or more layers may be between the etch layer 208 and the substrate 204. A mask 212 is formed over the etch layer 208. Although the mask 212 is shown on the etch layer 208, in other embodiments one or more layers, such as an anti-reflective coating, may be placed between the mask 212 and the etch layer 208. In the preferred embodiment, the etch layer 208 is a single layer. Preferably the single layer is uniform through out the thickness of the single layer forming the etch layer.

Figure 3:
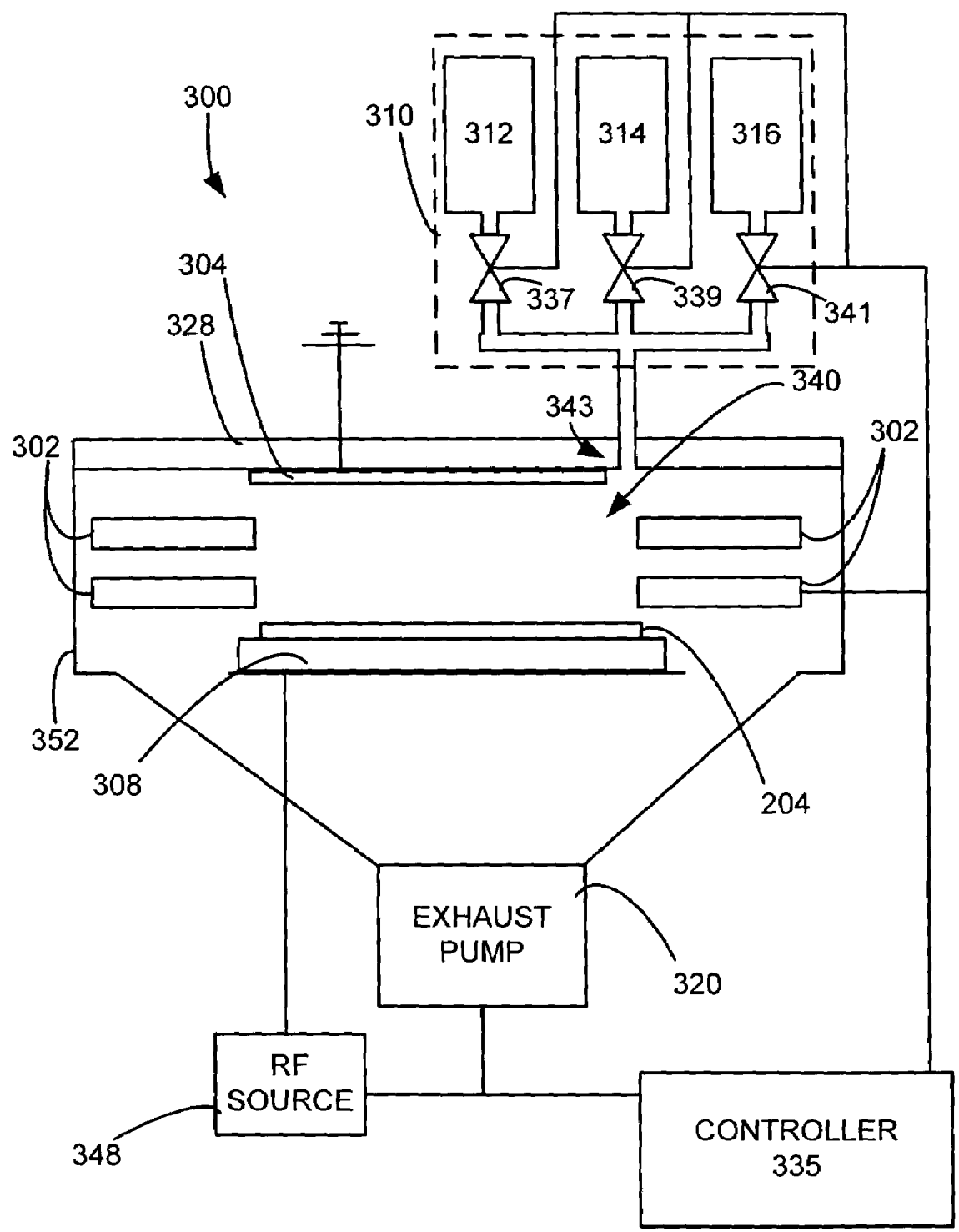
FIG. 3 is a schematic view of a process chamber that may be used in the preferred embodiment of the invention.

FIG. 3 is a schematic view of a process chamber 300 that may be used in the preferred embodiment of the invention. In this embodiment, the plasma processing chamber 300 is a 200 mm 2300 Exelan made by Lam® Research Corp. of Fremont, Calif., which comprises confinement rings 302, an upper electrode 304, a lower electrode 308, a gas source 310, and an exhaust pump 320. The gas source 310 may comprise a first gas source 312, a second gas source 314, and a third gas source 316. Within plasma processing chamber 300, the substrate wafer 204, over which the etch layer is deposited, is positioned upon the lower electrode 308. The lower electrode 308 incorporates a suitable substrate chucking mechanism (e.g., electrostatic, mechanical clamping, or the like) for holding the substrate wafer 204. The reactor top 328 incorporates the upper electrode 304 disposed immediately opposite the lower electrode 308. The upper electrode 304, lower electrode 308, and confinement rings 302 define the confined plasma volume 340. Gas is supplied to the confined plasma volume by gas source 310 through a gas inlet 343 and is exhausted from the confined plasma volume through the confinement rings 302 and an exhaust port by the exhaust pump 320. The exhaust pump 320 forms a gas outlet for the plasma processing chamber. In this embodiment, the upper electrode 304 is grounded. A RF source 348 is electrically connected to the lower electrode 308. Chamber walls 352 define a plasma enclosure in which the confinement rings 302, the upper electrode 304, and the lower electrode 308 are disposed. The RF source 348 may comprise a 27 MHz power source and a 2 MHz power source. Different combinations of connecting RF power to the electrode are possible. A controller 335 is controllably connected to the RF source 348, the exhaust pump 320, the confinement rings 302, a first control valve 337 connected to the deposition gas source 312, a second control valve 339 connected to the etch gas source 314, and a third control valve 341 connected to the additional gas source 316. The gas inlet 343 provides gas from the gas sources 312, 314, 316 into the plasma processing enclosure. A showerhead may be connected to the gas inlet 343. The gas inlet 343 may be a single inlet for each gas source or a different inlet for each gas source or a plurality of inlets for each gas source or other possible combinations. Other embodiments of the invention may use other types of plasma process chambers, such as the 2300 Exelan made by Lam Research Inc.

Figure 4:
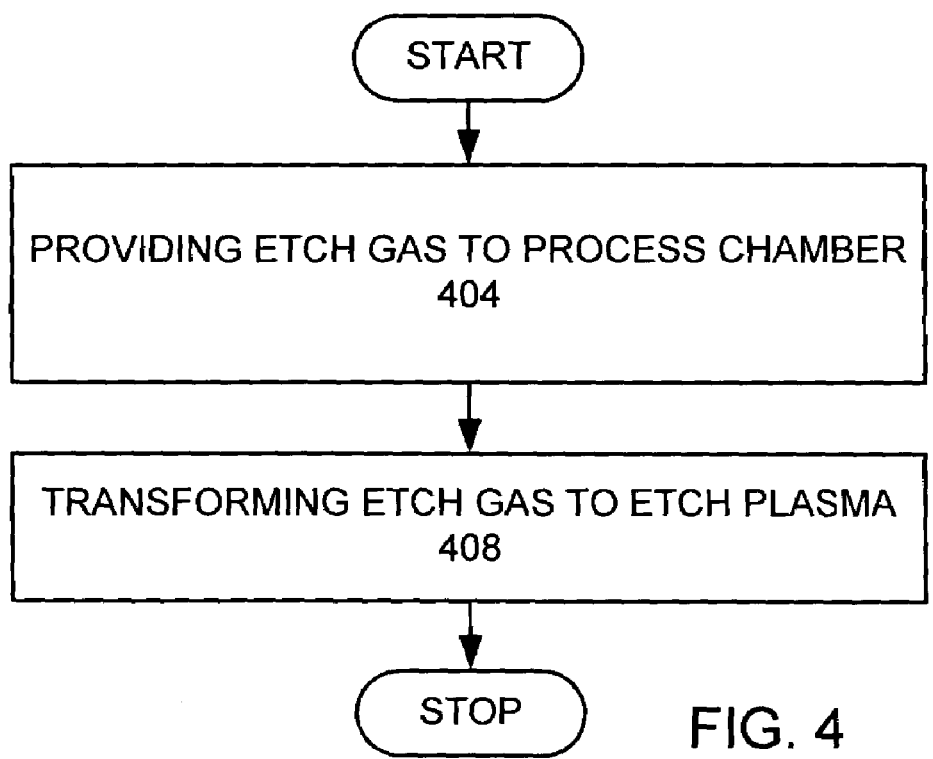
FIG. 4 is a more detailed flow chart of an embodiment of the providing of an etch plasma to the process chamber.

An etch plasma is then provided to the process chamber 300 (step 108). FIG. 4 is a more detailed flow chart of an embodiment of the providing an etch plasma to the process chamber (step 108). This may be done by providing an etch gas to the process chamber 300 (step 404). The etch gas may be a mixture of one or more gases. For example, the etch gas may be a mixture of a first gas from the first gas source 312, a second gas from the second gas source 314, and a third gas from the third gas source 316. The etch gas may then be transformed into the etch plasma (step 408). In the process chamber 300 illustrated above, this would be done by providing RF power from the RF power source 348 to the lower electrode 308, which excites the etch gas to transform the etch gas to the etch plasma.

Figure 8A:
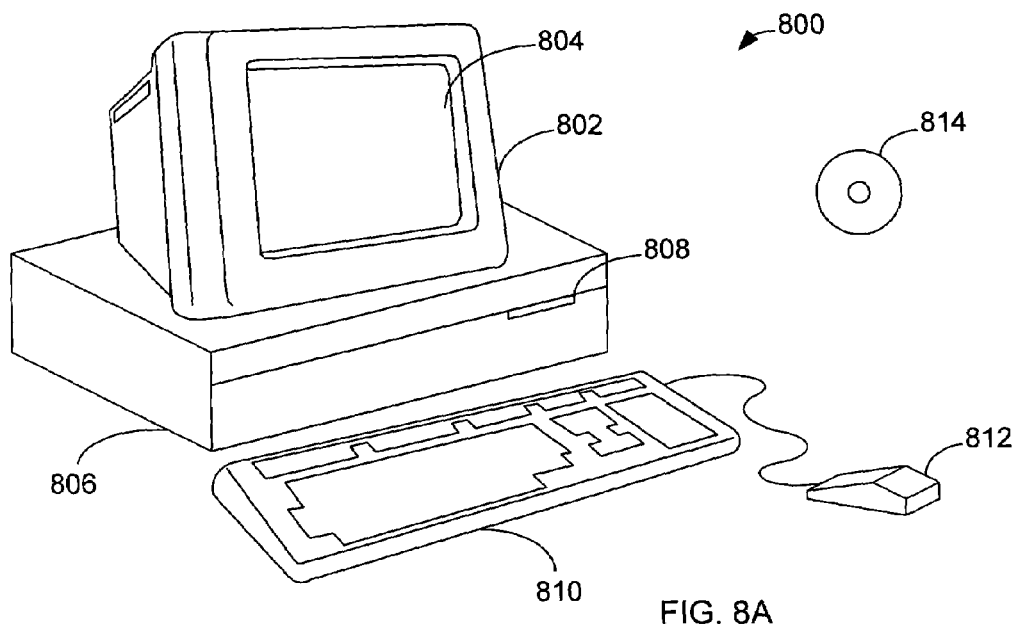
FIGS. 8A and 8B illustrate a computer system, which is suitable for implementing a controller used in embodiments of the present invention.
Figure 8B:
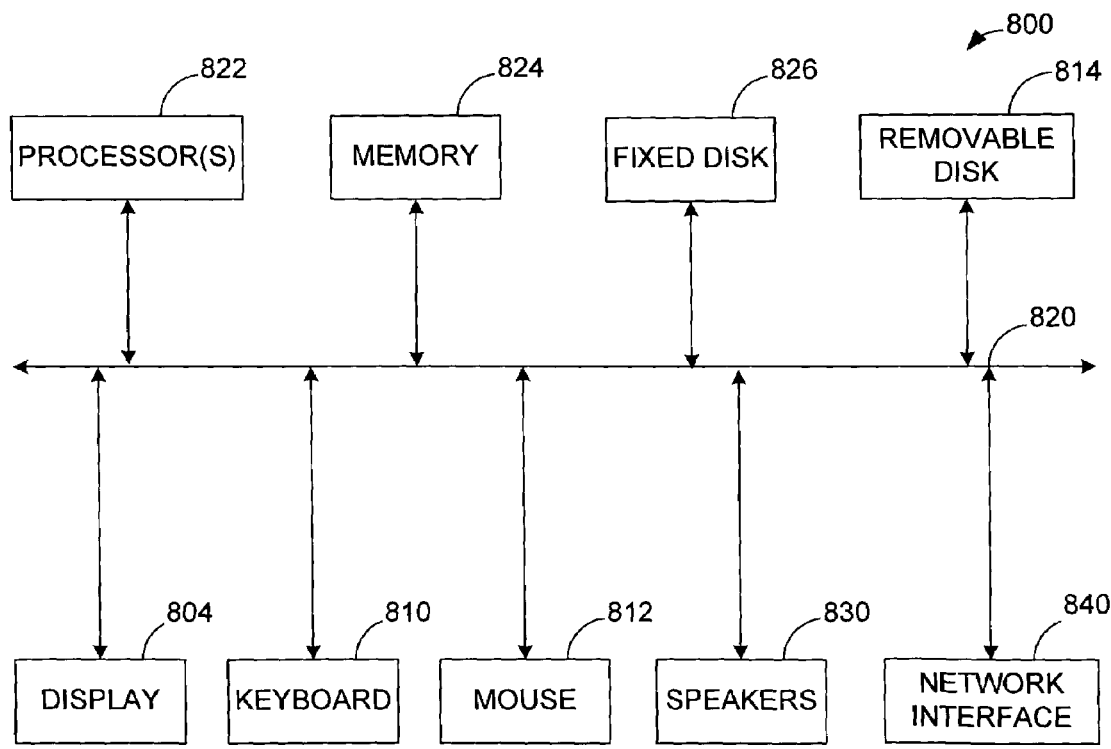

FIGS. 8A and 8B illustrate a computer system 800, which is suitable for implementing a controller 335 used in embodiments of the present invention. FIG. 8A shows one possible physical form of the computer system. Of course, the computer system may have many physical forms ranging from an integrated circuit, a printed circuit board, and a small handheld device up to a huge super computer. Computer system 800 includes a monitor 802, a display 804, a housing 806, a disk drive 808, a keyboard 810, and a mouse 812. Disk 814 is a computer-readable medium used to transfer data to and from computer system 800.

FIG. 8B is an example of a block diagram for computer system 800. Attached to system bus 820 is a wide variety of subsystems. Processor(s) 822 (also referred to as central processing units, or CPUs) are coupled to storage devices, including memory 824. Memory 824 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 826 is also coupled bi-directionally to CPU 822; it provides additional data storage capacity and may also include any of the computer-readable media described below. Fixed disk 826 may be used to store programs, data, and the like and is typically a secondary storage medium (such as a hard disk) that is slower than primary storage. It will be appreciated that the information retained within fixed disk 826 may, in appropriate cases, be incorporated in standard fashion as virtual memory in memory 824. Removable disk 814 may take the form of any of the computer-readable media described below.

CPU 822 is also coupled to a variety of input/output devices, such as display 804, keyboard 810, mouse 812 and speakers 830. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 822 optionally may be coupled to another computer or telecommunications network using network interface 840. With such a network interface, it is contemplated that the CPU might receive information from the network, or might output information to the network in the course of performing the above-described method steps.

Furthermore, method embodiments of the present invention may execute solely upon CPU 822 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

In the reactor, the etch plasma is used to etch at least one feature through the mask (step 112). The etch is optimized by ramping at least one etch parameter (step 116). An etch plasma parameter is any variable that may be controllably changed to change the resulting plasma composition. In the preferred embodiment, the etch parameter that is ramped is at least one of an increase in pressure and an increase in flow for at least one of the gases forming the etch gas. In other embodiments other etch parameters may be ramped, such as excitation power, bias power, RF frequency, temperature, He flow under the wafer, confinement ring position, gap height, or any other parameter that changes the plasma composition (including, but not limited to, changes to the residence time of the gas chamber). In the specification and claims, ramping is defined as a process of changing plasma parameters to better optimize the etch at each depth of a given layer.

The changing of the plasma parameters causes a change in the etch plasma composition. For example, when a gas flow is increased a new etch plasma composition results which may have different etch properties, selectivities, and effects on the profile. Likewise an increase in bias power may provide a different etch plasma composition with different etch properties, selectivities, and effects on the profile. Some of the reasons for changing the plasma composition by ramping are: 1) To optimize the plasma composition for a given result based on the natural changes in etch properties that occur for a given recipe as the feature deepens. This phenomenon, called Aspect-Ratio-Dependent-Etch (ARDE or sometimes RIE-lag), is usually attributed to a reduced efficiency to transport species involved in the etch reaction to the bottom of the feature. The plasma is ramped because the plasma composition naturally affects the feature differently for different feature depths, and the optimal recipe for a particular result changes as the etch progresses. 2) To limit the use of relatively "aggressive" recipes during the process. Ramping minimizes the use of aggressive recipes as they are only used for a portion of the etching time, as needed, rather than for the entire etch process. And 3) To minimize undesirable effects caused in a single-step recipe by ramping the process through multiple steps.

Possible implementations of ramped processes are discussed in the following section. The optimization of the etch by ramping may be used to achieve various results, some of which are related to one another. One optimization provided by ramping may use ramping to increase the etch aggressiveness of the etch plasma with respect to etch stop and/or a significantly tapered profile. An aggressive etch with respect to etch stop has a recipe that, if applied to the entire duration of the process, would etch-stop at a greater depth than a recipe that is less aggressive etch with respect to etch stop. A significantly tapered profile in an etch that results in a taper more than two degrees. An aggressive etch with respect to tapered profile is an etch that results in a taper with a smaller angle than a less aggressive etch with respect to tapered profile. Another optimization may be used to preserve the mask. In such an embodiment, ramping is provided that starts with a relatively low mask etch rate and then increases the mask etch rate over the ramp time, resulting in an overall reduction in the mask etch rate and an overall enhancement of the selectivity to the mask. This type of ramp conserves mask because the ramp is optimized to minimize the mask etch rate recipe for the changing feature depth. Another optimization may be used to reduce bowing. In such an embodiment, a ramp is provided that changes the position of the bow with the different etch conditions provided by the ramping. In doing so, the feature is etched with a reduction in the bow due to the continuous movement of the bow during the ramp. Another optimization may provide a ramp with a net result of reduced striation. The ramp allows a recipe to be used only as it is needed during the process, while utilizing recipes that cause fewer striations at the beginning of the ramp process.

Figure 5:
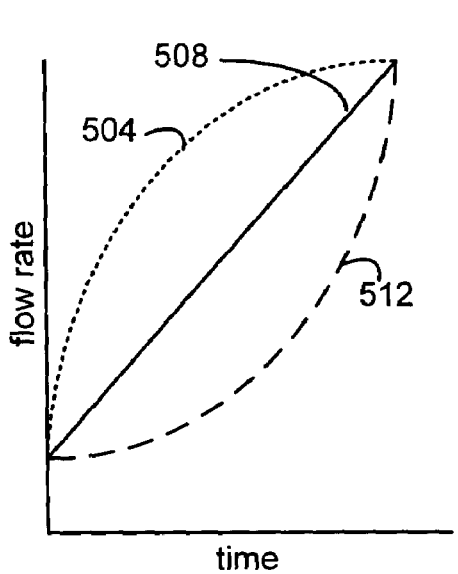
FIG. 5 is a graph of flow rates of one of the gases forming the etch gas versus time.

FIG. 5 is a graph of flow rates of one of the gases forming the etch gas versus time. Different ramp schemes may be used to either increase or decrease an etch parameters over the ramp time. For illustration purposes, a flow rate parameter is used here for the ramping scheme, although any number of previous listed parameters can actually be the ramped. A linear ramp 508 is a ramp where the flow rate increases linearly over time, as shown. A sub-linear ramp 512 is a ramp where the flow rate increases or decreases over time in a sub-linear fashion, as shown. An example of this type of ramping is an exponential, quadratic, or hyperbolic function, but many other more complicated functions are also suitable. A super-linear ramp 504 is a ramp where the flow rate increases or decreases over time in a super-linear fashion, as shown. All of the ramps in this graph are continuous ramps that can be approximated in practice either with software or with a series of discrete steps that mimic the ramp. Preferably, the ramp scheme is non-linear.

Figure 6:
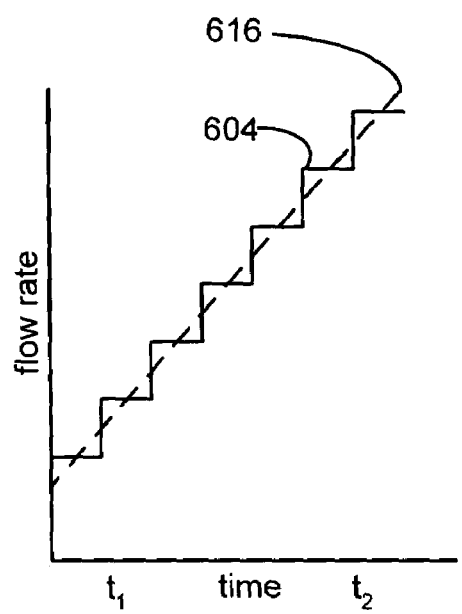
FIG. 6 is a graph of a discrete and discontinuous step function ramp.

FIG. 6 is a graph of a discrete and discontinuous step function ramp 604. This discrete ramp 604 increases flow over time in discrete steps. Dashed line 616 shows that the discrete ramp 604 provides a linear increase of flow over time. In this example, seven discrete steps are shown. Other embodiments may have more or fewer steps. Preferably, a step function ramp has at least three steps. More preferably, the step function ramp has at least five steps. More preferably, the step function ramp has at least seven steps. Most preferably, the step function ramp has as many steps as the software can reasonably provide, to most closely mimic a continuous ramp. For ramping using discrete steps, the duration of the ramping time is defined from the end of the first step to the beginning of the last step. Under such a definition, the ramping is from time $t_1$ to $t_2$, as shown. The steps may be individually manually entered or may be generated by a computer once endpoints are specified. In the example shown in FIG. 5, the ramping is linear, however in other embodiments the ramping may be non-linear.

In one embodiment, only a single gas is ramped. In other embodiments, more gases are ramped. A plurality of gases and other ramp parameters may be ramped at separate ramp functions or together at the same ramp function.

In this embodiment, the purpose of the ramping is that as the feature is first etched, the plasma is optimized for the short feature depth. For optimizing the ramp with respect to the mask selectivity for small aspect ratios, conditions much closer to etch-stop may be used than for higher aspect ratio. For example at low aspect ratios, an etch may take advantage of a process with plasma parameters that conserve photoresist. This provides for an overall increased etch selectivity and increased preservation of the mask. As the feature becomes deeper, the plasma composition is ramped up to provide a more aggressive etch to etch the deeper features, but this often sacrifices selectivity. By ramping the gas, the etch is made more aggressive according the need specified by the depth of the step. Closely tailoring the aggressiveness to the etch depth, as provided in a ramp of three or more steps, helps to minimize process sacrifices such as mask etch. Using an aggressive step through out the entire etch would erode the mask more quickly, requiring a thicker mask, which would increase the critical dimensions. In ramping, aggressive etches are only used as needed for the higher aspect ratios.

Figure 2B:
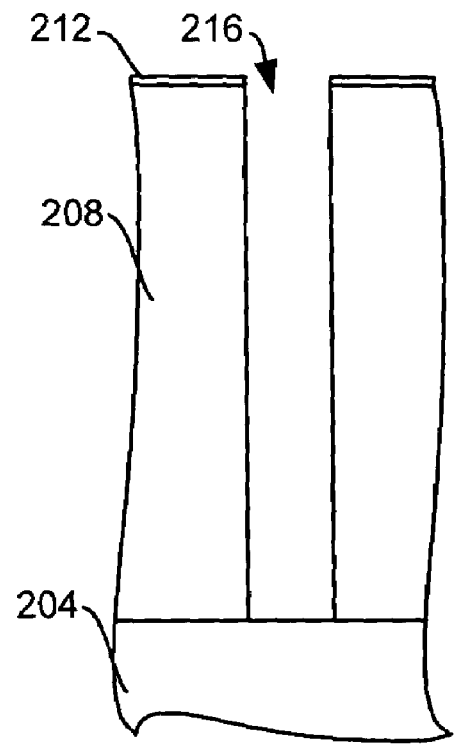

FIG. 2B is a cross-sectional schematic view of the substrate 204 with the etch layer 208 after a high aspect ratio feature 216 has been etched into the etch layer 208 through the mask 212. In this example, almost all (if not all) of the mask 212 is removed during the etching of the feature 216. It is desirable that the feature etch be as selective as possible to remove a little mask material as possible, to allow for a thinner mask, which results in smaller critical dimensions.

One of the advantages of the invention is providing a deeper high aspect ratio etch with a thinner mask, which provides smaller critical dimensions. Another advantage that can occur concurrently, or can be optimized for separately from the previous embodiment, is bow reduction. The desire is for a rectangular etch profile, with vertical sidewalls. Bow width is defined as the difference between the CD at the top and the CD at the widest location of the profile). The depth of the position of the bow can move depending on the etch process. An advantage is that a bow produced in range of locations by a series of recipes is smoothed out relative to bow produced at single location. As illustrated here, a benefit of the ramp is the ability to optimize multiple etch properties at once with a single ramp scheme. Examples of ramping optimizations that may be provided by the invention are etch selectivity, bow control, striation control, control of the top and bottom CD, etch rate, and profile control (preferably forming a rectangular profile).

EXAMPLES

In an example of the invention, the substrate is a silicon substrate, the etch layer is a silicon oxide dielectric layer, and the mask is a photoresist mask.

Baseline Main Etch

A baseline main etch of the dielectric layer is performed in the above mentioned Exelan using the following recipe. The process chamber pressure was set to about 45 millitorr. The 27 MHz RF source provided about 1500 Watts of power to the lower electrode. The 2 MHz RF source provided about 1500 Watts of power to the lower electrode. A flow of about 300 sccm Ar, 30 sccm $C_4F_8$, and 10 sccm $O_2$ forming an etch gas was provided. A helium cooling pressure, to cool the substrate, was 20 Torr. The lower electrode was maintained at 0° C. The upper electrode was maintained at 140° C. The baseline etch was carried out for about 250 seconds.

First Ramp Test Main Etch

A first ramp test main etch comprised a five step process with the following recipe. In each step, the process chamber pressure was set to 45 millitorr. The 27 MHz RF source provided about 1500 Watts of power to the lower electrode. The 2 MHz RF source provided about 1500 Watts of power to the lower electrode. A helium cooling pressure, to cool the substrate was 20 Torr. The lower electrode was maintained at 0° C. The upper electrode was maintained at 140° C.

In a first step a flow of about 170 sccm Ar, 15 sccm $C_4F_8$, and 6 sccm $O_2$ forming an etch gas was provided. The first step was carried out for 50 seconds. In a second step a flow of about 200 sccm Ar, 19 sccm $C_4F_8$, and 7 sccm $O_2$ forming an etch gas was provided for 150 seconds, which provided coupon 1. In a third step a flow of about 220 sccm Ar, 21 sccm $C_4F_8$, and 7 sccm $O_2$ forming an etch gas was provided for 70 seconds. In a fourth step a flow of about 250 sccm Ar, 23 sccm $C_4F_8$, and 8 sccm $O_2$ forming an etch gas was provided for 60 seconds, which provided coupon 2. In a fifth step a flow of about 300 sccm Ar, 30 sccm $C_4F_8$, and 10 sccm $O_2$ forming an etch gas was provided for 40 seconds, which provided coupon 3. Therefore, the flow rates of all three component gases are individually ramped up.

Figure 7:
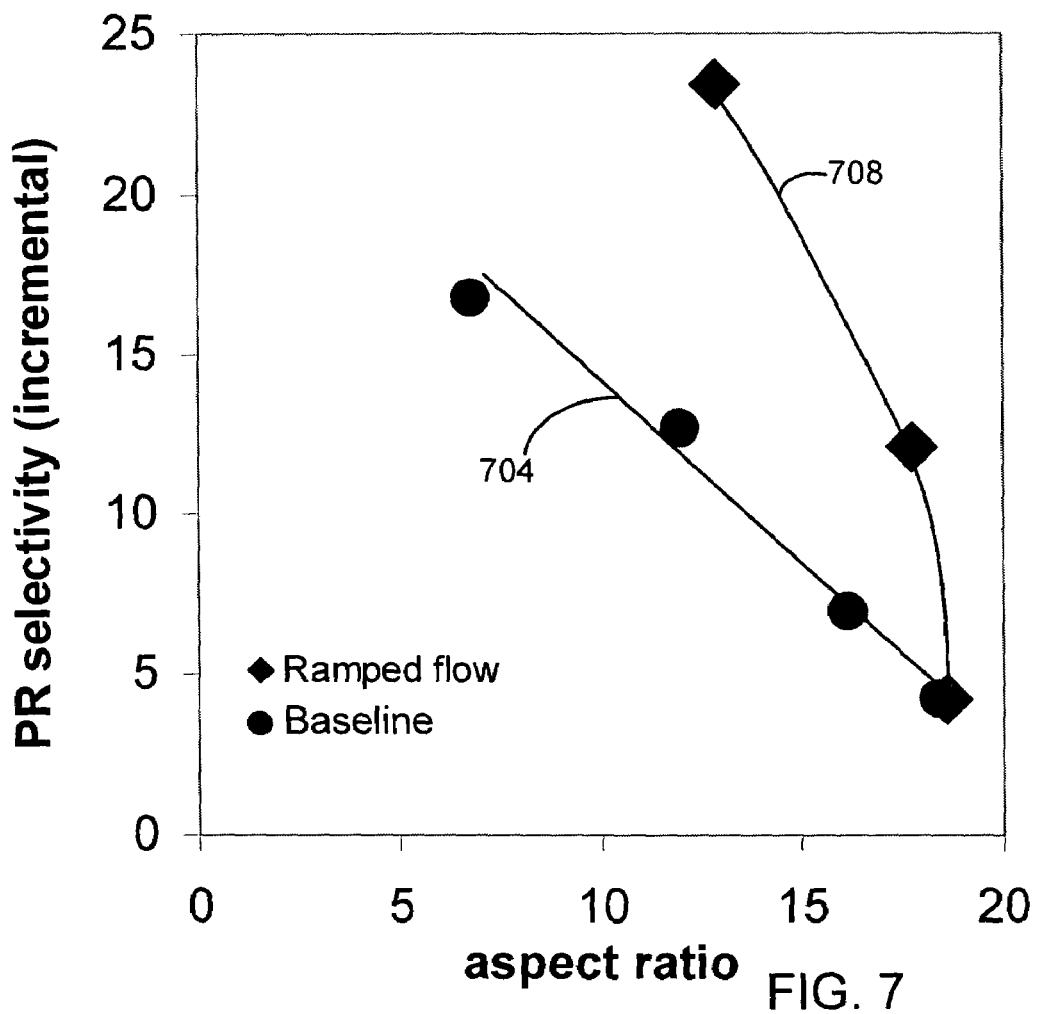
FIG. 7 is a graph of the photoresist selectivity for the baseline main etch and the first ramp etch.

FIG. 7 is a graph of the photoresist selectivity for the baseline main etch 704 and the first ramp etch 708. As can be seen from the graph, the initial selectivity of the first ramp etch is much greater than the selectivity of the baseline main etch. Near the end of the process the ramping of the first ramp etch causes the selectivity of the first ramp etch to be about the same as the selectivity of the base line etch. Overall, much less photoresist is removed during the first ramp etch than the baseline main etch. Therefore the first ramp etch may use a much thinner photoresist mask, which improves the critical dimensions of the feature.

TABLE 1

|  | Bow width | Depth (um) | Aspect ratio | Process time (s) |
| --- | --- | --- | --- | --- |
| Baseline | 0.257 | 3.12 | 15.6 | 250 |
| coupon1 | None | 2.58 | 12.9 | 200 |
| coupon2 | 0.21 | 3.55 | 17.75 | 330 |
| coupon3 | 0.217 | 3.72 | 18.6 | 360 |

Table 1 shows the bow width, depth, aspect ratio, and process time for the base mainline etch and the different coupons of the first ramp etch. The bow width of the baseline main etch is 0.257 micron. The bow width of the various stages of the first ramp etch is less than 0.257 micron. The depth shows that the first ramp etch provides a deeper etch depth. Table 1 also shows that the first ramp etch provides a higher aspect ratio with reduced consumption of mask.

TABLE 2

|  | Bulk accumulated pr etched | Accumulated selectivity |
| --- | --- | --- |
| baseline |  | 16 |
| coupon1 | 0.11 | 52 |
| coupon2 | 0.19 | 27 |
| coupon3 | 0.23 | 22 |

Table 2 shows the bulk accumulated photoresist etched and accumulated selectivity for the baseline etch and each coupon at various stages of the ramped etch.

Figure 10A:
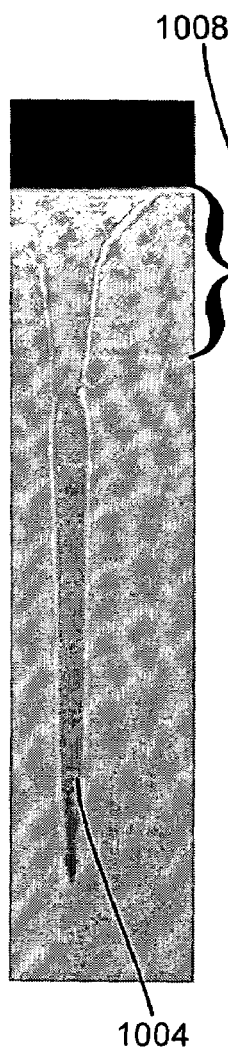
FIGS. 10A–C are photomicrographs of the cross section of the feature at various stages of the first ramp etch before the photoresist is stripped.
Figure 10B:
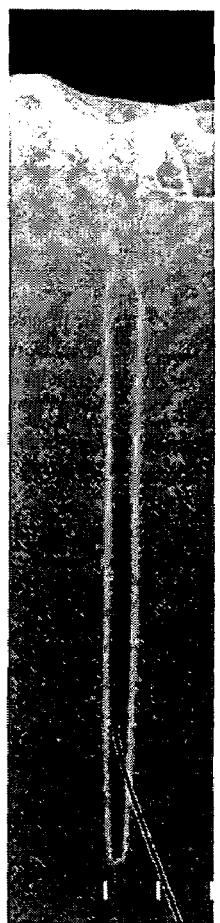
Figure 10C:
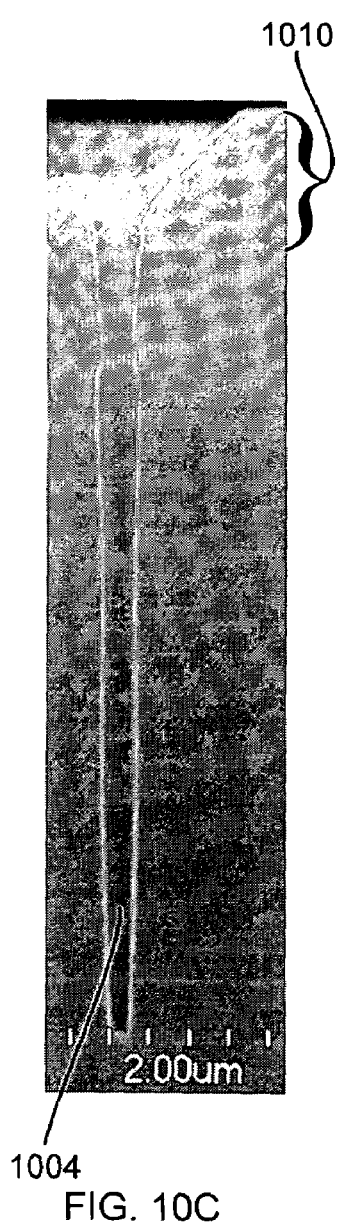
Figure 10D:
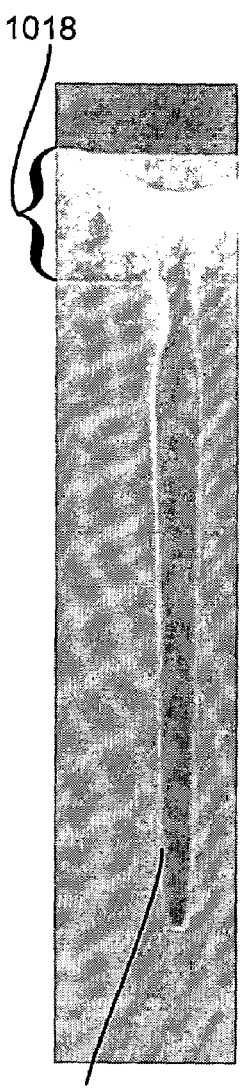
FIG. 10D is a photomicrograph of a cross section of a feature etched using the baseline main etch before the photoresist was stripped.

FIG. 10A is a photomicrograph of a cross section of a feature 1004 after the second step of the first ramp etch. The high selectivity of the first and second steps provides a large photoresist thickness 1008. FIG. 10B is a photomicrograph of the cross section of the feature 1004 after the fourth step of the first ramp etch. The third and fourth etch steps allow etching to a higher aspect ratio, as shown and are closer to the selectivity of the baseline. FIG. 10C is a photomicrograph of the cross section of the feature 1004 after the fifth step of the first ramp etch. The fifth step allows etching to a higher aspect ratio, as shown, and its selectivity is now similar to that of the baseline etch. FIG. 10D is a photomicrograph of a cross section of a feature 1016 etched using the baseline main etch. The feature 1016 formed from the baseline main etch is not as deep as the feature 1004 formed from the first ramp etch due to the reduced total process time. In addition, the feature 1016 from the baseline main etch appears to show more bowing than the feature 1004 formed from the first ramp etch, and would only increasingly worsen had it been etched to the depth of the ramped etch. In addition, the thickness 1010 of the photoresist mask after the fifth etch step is larger than the thickness 1018 of the photoresist mask after the baseline main etch, even though the feature 1016 from the baseline main etch is not as deep as the feature 1004 after the fifth step of the first ramp etch. This would allow a thinner mask to be used for the first ramp etch to obtain a deeper feature than can be obtained using the baseline main etch with a thicker photoresist mask. Conversely, one could use the same mask thickness for a deeper etch using the ramping. The baseline etch may also be showing a self limiting effect.

Figure 9A:
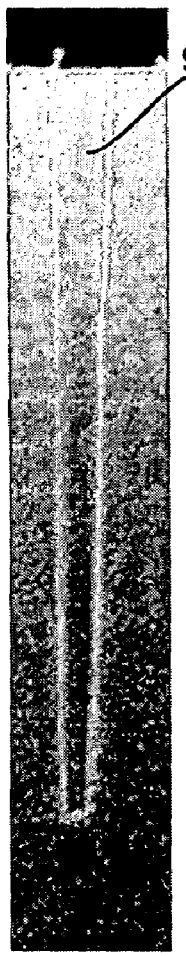
FIGS. 9A–C are photomicrographs of the cross section of the feature at various stages of the first ramp etch after the photoresist is stripped.
Figure 9B:
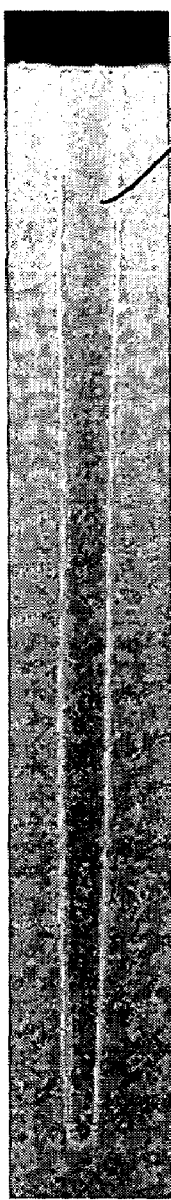
Figure 9C:
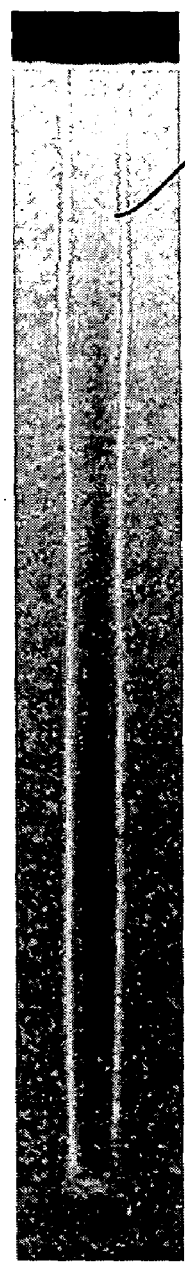
Figure 9D:
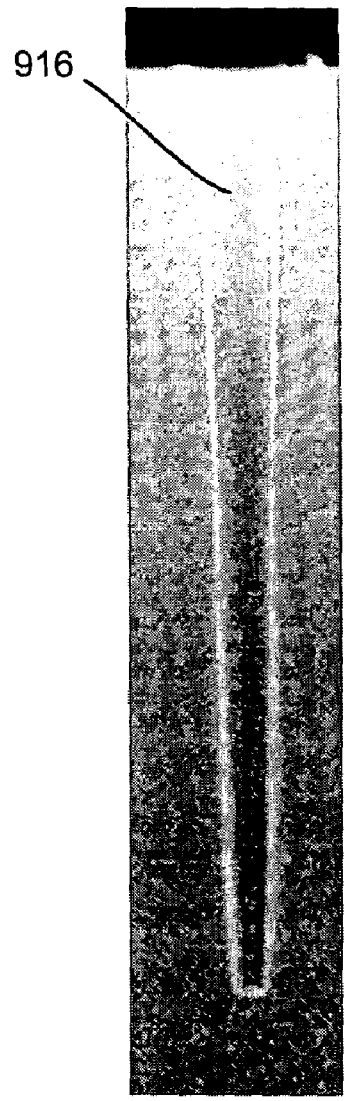
FIG. 9D is a photomicrograph of a cross section of a feature etched using the baseline main etch after the photoresist is stripped.

FIG. 9A is a photomicrograph of a cross section of a feature 904 after the second step of the first ramp etch and after the photoresist has been stripped from the coupon. FIG. 9B is a photomicrograph of the cross section of the feature 904 after the fourth step of the first ramp etch after the photoresist has been stripped from the coupon. FIG. 9C is a photomicrograph of the cross section of the feature 904 after the fifth step of the first ramp etch after the photoresist has been stripped from the coupon. FIG. 9D is a photomicrograph of a cross section of a feature 916 etched using the baseline main etch after the photoresist has been stripped. The removal of the photoresist helps to better illustrate the improved profile provided by the invention.

Second Ramp Test Main Etch

A second ramp test main etch comprised a three step process with the following recipe. The 27 MHz RF source provided about 1500 Watts of power to the lower electrode. The 2 MHz RF source provided about 1500 Watts of power to the lower electrode. A helium cooling pressure, to cool the substrate was 20 Torr. The lower electrode was maintained at about 0° C. The upper electrode was maintained at 140° C.

In a first step a flow of about 200 sccm Ar, 15 sccm $C_4F_8$, and 6 sccm $O_2$ forming an etch gas was provided at a process chamber pressure of 30 mTorr. The first step was carried out for 150 seconds. In a second step a flow of about 280 sccm Ar, 25 sccm $C_4F_8$, and 7 sccm $O_2$ forming an etch gas at a process chamber pressure of 45 mTorr. The second step was provided for 100 seconds. In a third step a flow of about 330 sccm Ar, 30 sccm $C_4F_8$, and 8 sccm $O_2$ forming an etch gas at a process chamber pressure of 50 mTorr was provided for 100 seconds. Therefore, the flow rate of all three component gases and chamber pressure are individually ramped up.

FIG. 11A is a photomicrograph of a cross section of a feature 1104 etched using the second ramp test main etch, after the photoresist has been stripped. FIG. 11B is a photomicrograph of the cross section of the feature 1116 etched using the baseline etch after the photoresist has been stripped. The removal of the photoresist helps to better illustrate the improved profile provided by the invention. The deeper etch provided by the second ramp test main etch may also be seen.

As shown by the first example the inventive ramping provides improved overall selectivity, by using lower flow rates that had the ability to conserve photoresist at the beginning by using less aggressive conditions. As shown by both examples the inventive ramping provides narrower overall bow width, as the bow is smoothed out as its position is changed with the changing plasma conditions.

These examples provided ramping from during a significant portion of the process. In these examples, the duration of the ramping time is defined from the end of the first step to the beginning of the last step. Under such a definition, the first ramp test main etch would have ramping for a duration of about 150+70+60=280 seconds of the total 370 second etch process. The second ramp test main etches each would have a ramp for a duration of 100 seconds under the above definition. It is preferred that the ramping have a duration of at least 30 seconds. It is more preferred that the ramping have a duration of at least 100 seconds. It is most preferred that the ramping have a duration of at least 200 seconds. For a continuous ramp, the ramping time is from the beginning to the end of the continuous ramp.

Under the above definition, it is preferred that at least about 0.5 microns are etched during the ramping. More preferably, at least 1 microns are etched during ramping. Most preferably, at least 2 microns are etched during ramping. For the first ramp test main etch, the ramping occurs during 280 seconds of the 370 second duration of the etch. Therefore, the ramping occurs for 280/370=76% of the etch duration. Preferably, the ramping occurs for at least 10% of the duration of the etch. More preferably, the ramping occurs for at least 30% of the duration of the etch. Most preferably, the ramping occurs for at least 70% of the duration of the etch.

The invention is applicable for any type of resist, including but not limited to newer 193 nm resists that are more easily etched, so that increased selectivity is of an even greater value. With ramping, thinner resists can be used to achieve the same feature depth as would otherwise be done with thicker resists. Conversely, the ramping makes deeper etches possible for a given resist thickness, by the conservation of mask. In addition, if a deeper etch is required, this can be achieved by simply continuing the ramp to deeper depths instead of experimenting with different parameters to see which set of parameters yield the desired etch depth and selectivity.

In other embodiments of the invention the etch layer may be a conductive layer such as a silicon or metal layer.

While this invention has been described in terms of several preferred embodiments, there are alterations, permutations, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching a feature in an etch layer through a mask over a substrate, comprising:

placing the substrate in a process chamber;
providing a first etch plasma composition to the process chamber, wherein the first etch plasma composition begins etch a feature in the etch layer;
providing a second etch plasma composition, wherein the second etch plasma composition continues to etch the feature in the etch layer; and
providing a third etch plasma composition, wherein the third etch plasma composition continues to etch the feature in to etch layer, wherein the third etch plasma composition is more aggressive with respect to etch stop than the second etch plasma composition and the second etch plasma composition is more aggressive with respect to etch stop than the first etch plasma composition, and wherein the first etch plasma is more selective than the second etch plasma and the second etch plasma is more selective than the third etch plasma.

2. The method, as recited in claim 1, wherein the etch layer is a dielectric layer.

3. The method, as recited in claim 1, wherein the first etch plasma being more selective than the second etch plasma means that the first etch plasma more selectively etches the etch layer with respect to the mask than the second etch plasma and wherein the second etch plasma being more selective than the third etch plasma means that the second etch plasma more selectively etches the etch layer with respect to the mask than the third etch plasma.

4. The method, as recited in claim 1, wherein the providing the first etch, the second etch, and the third etch, provides a ramping of at least one etch plasma parameter during the etching of the feature that optimizes plasma parameters to a changing etch depth and etching with the ramped plasma until the feature is etched to a feature depth.

5. The method, as recited in claim 4, wherein the ramping occurs over a time period of greater than 30 seconds.

6. The method, as recited in claim 4, wherein the ramping occurs over greater than 50% of the duration of the etch.

7. The method, as recited in claim 4, wherein the ramping is a non-linear ramping.

8. A method for etching a feature in a single uniform etch layer through a mask over a substrate, comprising:
placing a substrate in a process chamber;
providing an etch plasma to the process chamber, wherein the etch plasma begins to etch, comprising:
providing an etch gas with a component gas, wherein the etch gas has an etch gas flow rate and the component gas has a flow rate, and
energizing the etch gas to convert the etch gas to an etch plasma;
etching a feature in the single uniform etch layer with the etch plasma;
ramping the flow rate of the component gas during the etching of the feature into the single uniform etch layer until the feature is etched to a feature depth, wherein the ramping occurs for at least 30% of the duration of the etch, wherein the ramping is at least one of a continuous ramping and a series of discrete steps that mimic a continuous ramping.

9. The method, as recited in claim 8, wherein the ramping up occurs over a time period of greater than 30 seconds.

10. The method, as recited in claim 8, wherein the ramping occurs over greater than 50% of the duration of the etch.

11. The method, as recited in claim 8, wherein the ramping is a non-linear ramping.

12. The method, as recited in claim 8, wherein the ramping is a linear ramping.

13. The method, as recited in claim 8, wherein the ramping decreases etch selectivity between the single uniform etch layer and the mask.

14. The method, as recited in claim 8, wherein the ramping increases etch aggressiveness with respect to etch stop.

15. The method, as recited in claim 8, wherein the single uniform layer is a dielectric layer.

16. The method, as recited in claim 8, wherein the single uniform layer is a low k dielectric layer.

17. An apparatus for etching a feature in an etch layer through a mask over a substrate, comprising:
a plasma processing chamber, comprising:
a chamber wall forming a plasma processing chamber enclosure;
a substrate support for supporting a substrate within the plasma processing chamber enclosure;
a pressure regulator for regulating the pressure in the plasma processing chamber enclosure;
at least one electrode for providing power to the plasma processing chamber enclosure for sustaining a plasma;
a gas inlet for providing gas into the plasma processing chamber enclosure; and
a gas outlet for exhausting gas from the plasma processing chamber enclosure;
a gas source in fluid connection with the gas inlet,
a controller controllably connected to at least one of the gas source the at least one electrode, the pressure regulator, the gas inlet, and the gas outlet, comprising:
at least one processor; and
computer readable media, comprising:
computer readable code for providing an etch gas with a component gas from the gas source through the gas inlet into the plasma processing chamber at a flow rate, wherein the component gas has a flow rate;
computer readable code for energizing the at least one electrode to convert the etch gas to an etch plasma to cause a feature to be etched into the etch layer;
computer readable code for ramping the flow rate of the component gas to etch features into a single uniform etch layer, wherein the ramping occurs for at least 30% of the duration of the etch, wherein the ramping is at least one of a continuous ramping and a series of discrete steps that mimic a continuous ramping.

* * * * *